United States Patent [19]

Pinkasovich

[11] 4,299,558
[45] Nov. 10, 1981

[54] SWITCHING DEVICES FOR PHOTOFLASH UNIT

[75] Inventor: Juliana Pinkasovich, South Euclid, Ohio

[73] Assignee: General Electric Company, Schenectady, N.Y.

[21] Appl. No.: 40,848

[22] Filed: May 21, 1979

[51] Int. Cl.³ .............................................. F21K 5/02
[52] U.S. Cl. .................................. 431/359; 252/514; 337/416; 338/15; 362/13
[58] Field of Search ............... 431/357, 358, 359, 362, 431/365; 337/401, 413, 416; 252/506, 510, 514, 518; 338/13, 15, 18; 362/11, 13, 15; 361/249

[56] References Cited

U.S. PATENT DOCUMENTS

| | | | |
|---|---|---|---|
| 3,297,846 | 1/1967 | Peltier | 337/416 |
| 3,458,270 | 7/1969 | Ganser et al. | 431/359 |
| 3,459,488 | 8/1969 | Schroder et al. | 431/359 |
| 3,988,647 | 10/1976 | Bolon et al. | 431/359 X |
| 3,990,832 | 11/1976 | Smialek et al. | 338/15 X |
| 3,990,833 | 11/1976 | Holub et al. | 252/506 X |
| 4,080,155 | 3/1978 | Sterling | 431/359 |
| 4,133,631 | 1/1979 | Collins et al. | 362/13 X |
| 4,182,608 | 1/1980 | Chevali et al. | 252/514 X |

Primary Examiner—Samuel Scott
Assistant Examiner—Randall L. Green
Attorney, Agent, or Firm—John F. McDevitt; Lawrence R. Kempton; Philip L. Schlamp

[57] ABSTRACT

An improved solid state radiant energy switch device is described for operation with a plurality of flash lamps fired individually and in sequence and which is activated by radiant energy generated during flashing of the lamps to convert from a high electrical resistance ("off" condition) to a low electrical resistance or conductive state ("on" condition). Said switches are prepared from an improved material composition which undergoes chemical conversion comprising a carbon-containing silver salt admixed with a humidity-resistant organic polymer binder in ratios wherein said polymer binder does not exceed more than about three percent by weight in said admixture.

7 Claims, 3 Drawing Figures

U.S. Patent    Nov. 10, 1981    4,299,558
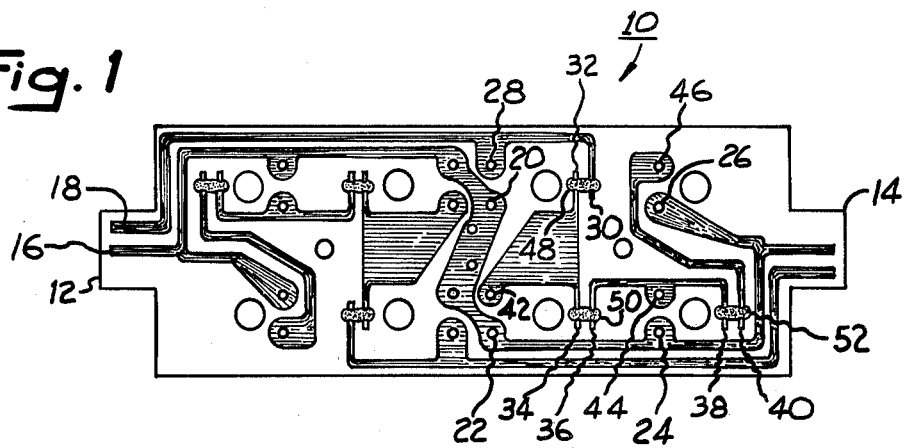
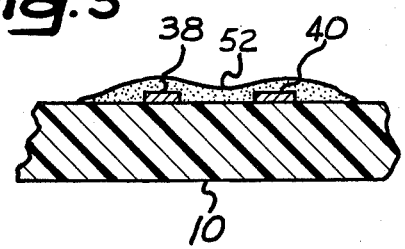
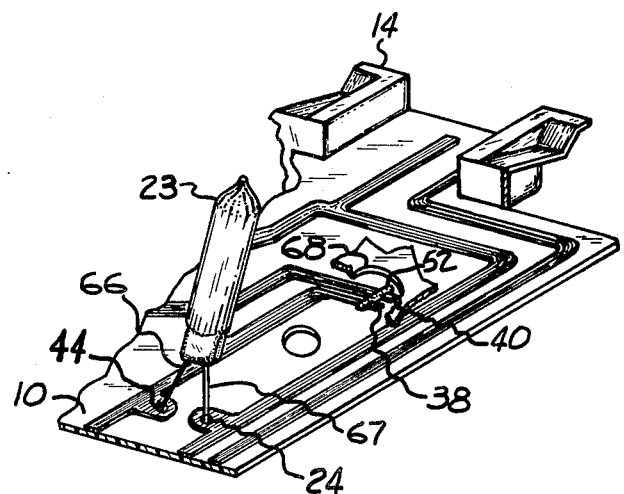

SWITCHING DEVICES FOR PHOTOFLASH UNIT

BACKGROUND OF THE INVENTION

The present invention is in the general field of multiple photoflash lamp arrays, such as flash cubes and planar arrays, which employ an operatively associated electrical circuit to enable the flash lamps to be fired individually and in sequence. Photoflash units of this type are well known and described in the U.S. Pat. Nos. 3,990,832 and 3,990,833, both assigned to the assignee of the present invention, and the flash sequencing electrical circuit means therein disclosed employ solid state radiant energy switch devices to enable the desired switching action. In accordance with said prior art photoflash lamp units, there is included a plurality of flash lamps, a circuit board with an electrical circuit into which said lamps are arranged to fire individually and in sequence, and a plurality of solid state radiant energy switching devices as part of the electrical circuit. Each device is located adjacent one of the lamps to receive radiant energy emitted by that lamp, the device being a mass of a composition preferably comprising silver oxide, a carbon-containing silver salt and a humidity resistant organic polymer binder. This switch initially has a high electrical resistance ("off" condition) and after undergoing thermochemical change as a result of the radiant energy emitted by the lamp, the silver oxide and silver salt are converted to metallic silver which has a relatively low electrical resistance ("on" condition). As further previously known, silver oxide if used alone as a silver source renders the switch overly sensitive in reacting too vigorously when converting to the low electrical resistance state. By substituting a carbon containing silver salt as part of the silver source, the switch becomes less sensitive when converting yet the switch is still sufficiently sensitive to convert reliably when the adjacent lamp is flashed. If the silver source consists of a carbon containing silver salt alone, however, the switch may not be sufficiently sensitive to convert reliably when exposed to thermal energy of the adjacent flash lamp. The prior art switch material also comprises an admixture of the aforementioned constituents having various portions of binder to silver source and with said proportions being generally dependent upon chemical composition of said constituents. In one preferred embodiment, the switch material composition is formulated to provide the desired sensitivity of operation with a known flash lamp construction by utilizing stoichiometric proportions for the binder and silver source constituents. More particularly, the desired conversion of silver oxide ($Ag_2O$) and/or a carbon containing silver salt such as silver carbonate ($Ag_2O$) to elemental silver is said to take place with accompanying combustion of the organic binder wherein at least part of the oxygen required from said combustion is obtained from chemical reduction of the silver source material. A complete reduction of the silver source material in said manner is thereby promoted if stoichiometric principles are applied for the proportions of silver source material and binder in a mixture. As an example of these principles, it can be seen that each $Ag_2CO_3$ or $Ag_2O$ molecules furnishes one oxygen atom for combustion of the organic binder thereby requiring one or two oxygen atoms for each carbon atom (depending upon whether CO or $CO_2$ is a reaction product) as well as one-half an oxygen atom for each hydrogen atom in the binder. By following said above defined stoichiometric ratios, the weight fractions of the specified constituents are accordingly adjusted to provide the desired complete conversion of the silver source to elemental silver.

Unfortunately, it has been found that such stoichiometric formulation of the switch material composition still leads to such an overly vigorous reaction that switches are blown off the circuit board. This loss causes an interruption in the electrical circuit path precluding further actuation of unflashed lamps in the present circuit arrangement. A method employed to avoid such circuit impairment has been to increase the thickness of the switching devices deposited on the circuit board so that some converted switch material will still reamin, but such method understandably increases manufacturing costs. It is desirable, therefore, to provide a more reliable switch operation in this regard without necessitating a significant substitution of material compositions or requiring a substantial departure from methods now employed to form the switch device.

SUMMARY OF THE INVENTION

It has now been discovered that a more reliable switch conversion from the high electrical resistance condition to the low electrical resistance condition can be effected with a switch material comprising a carbon-containing silver salt admixed with a humidity resistant organic polymer binder in ratios wherein said polymer binder does not exceed about three percent by weight in said admixture. By lowering the relative proportions of the binder fuel in said admixture to less than the stoichiometric amount, it has still been found, surprisingly, that sufficient conversion of silver source takes place to provide the desired switching action reliably. The improved switching action is particularly significant in photoflash units now being manufactured since the flash lamps employed provide higher intensity light output enhancing more complete conversion of the silver source to elemental silver. Such cooperative action makes it further possible to achieve reliable switching operation with switch devices having a reduced thickness of 3.5 mils or less.

Useful carbon containing silver salts for the present improved switch material must be relatively stable under conditions of high humidity and exhibit high electrical resistance. Such salts can either be organic or inorganic compounds and these include silver carbonate, silver pyruvate, silver acetylacetonate, silver acetate, silver oxalate, silver citrate, silver behenate, silver benzoate and silver fumarate. Silver oxide has not been found particularly useful in the present switch material by reason of its overly vigorous conversion characteristics as well as lack of stability under high humidity and elevated temperature conditions which imparts a limited shelf life to the switching device.

Useful binder materials for the present switch composition can be selected from the class of humidity resistant organic polymers which can be employed in the form of a liquid suspension to prepare the switch device. As above indicated, the amount of organic polymer binder in the switch composition is maintained from a limited amount sufficient to produce adhesion of said material to the underlying circuit board substrate up to about three percent weight of the admixture. Accordingly, the useful binders include the cellulose esters such as cellulose nitrate and cellulose acetate butyrate; the cellulose ethers such ethyl cellulose and ethyl hydroxy ethyl cellulose; acrylates such as polymethyl methacrylate, polymethyl acrylate; polycarbonate; and polystyrene as well as styrene copolymers such as the thermoplastic block copolymer of styrene with butadiene.

The present switch material can be applied to the circuit board between a pair of electrical terminals all in conventional fashion utilizing further conventional coating techniques requiring presence of an organic diluent or solvent. Solvents include pine oil, hydrocarbon fluids, esters, for example, butyl acetate, etc. which are conventionally used for deposition of the switches by silk screening. The material for deposition can be prepared as a liquid coating mixture utilizing said organic liquids that is formed by mixing the silver salt with the organic binder to form a slurry. The slurry may be applied across said terminals by conventional means as a thin coating and the solvent thereafter evaporated to provide a solid switch device. A dispersing agent such as non-ionic organic surfactant is useful in preparing such liquid suspensions of the switch material and with said surfactant being substituted for part of the organic polymer binder in said admixture to serve as another fuel constituent therein.

BRIEF DESCRIPTION OF THE DRAWINGS

The present improvement is more clearly understood from the following description taken in conjunction with the accompanying drawings in which:

FIG. 1 is a top view of a conventional circuit board showing the electrical circuitry of a multiple flash lamp unit incorporating the present switch devices;

FIG. 2 is a three-dimensional broken-away view showing a single flash lamp in a slightly raised position and also showing the relationship between a lamp and a switch; and FIG. 3 is a cross sectional view through a single switch and the connecting terminals as shown in FIG. 2.

DESCRIPTION OF THE PREFERRED EMBODIMENTS

In FIG. 1 there is shown a circuit board member 10 for a conventional photoflash unit which furnishes the support means for a plurality of flash lamps (not shown) that are secured to said board member by their lead-in wires. Said board 10 further includes electrical circuitry for the sequential firing of two groups of flash lamps having four lamps in each group. Plug-in connector tabs 12 and 14 may be formed integrally with the circuit board 10 on the opposite ends thereof as shown. While an entire illustrated printed circuit is shown, only the portion of the printed circuit servicing one group of four lamps located at the right side of said board will be discussed in detail since the portion of the printed circuit servicing the remaining group of four lamps depicted on the left side of said board constitutes a reverse mirror image thereof. Said circuit board 10 is considered from the point of view of being plugged into the camera (also not shown) through the connector tab 12 whereby circuit board terminals 16 and 18 make electrical contact for the flash activation means of the camera. The circuit board terminal 16 is part of a continuous conductor run on the board which is connected to one electrical lead of all four flash lamps in the group at points 20, 22, 24 and 26 by suitable means such as soldering, welding or crimping. The second terminal 18 is part of a conductor run that is connected to the second lead wire of one lamp in said four-lamp group at point 28 and terminates at radiation switch terminal 30 which is close to, but spaced apart from, radiation switch terminal 32. Similarly, switch terminal pairs are located at 34–36 and 38–40 for proper sequencing of the remaining three lamps in said four-lamp group. The second lead wires of said remaining three lamps in the group are secured to points 42, 44 and 46 to complete electrical termination of all four lamps in the continuous conductor run on the circuit board connected to the camera. Remaining radiation switches 48, 50 and 52 which are operatively associated with said four-lamp group are respectively positioned to be in contact with and bridge across the respective pair of switch terminals 30–32, 34–36, and 38–40. Initially, all the switches are in the "off" condition which permits only the first lamp in the sequence to be fired. The firing of any flash lamp turns the switch adjacent thereto to the "on" condition. When operated with lamps which become open circuited upon flashing, the described circuit embodiment employs the present switch devices to sequence the next unflashed lamp in the group by means of a parallel connection of the lamps with the switch devices being connected in series with one another. Comparable results could be produced with the same type flash lamps being connected in parallel with respect to one another by having each switch device connected in series with the branch circuits for the flash lamps.

FIG. 2 illustrates a single flash lamp 23 in said above described four-lamp grouping and being depicted in a slightly raised elevation to show the relative position between the lamp 23 and the switch 52 adjacent thereto. The flash lamp 23 is attached to and supported by the printed circuit board 10 through leads 66 and 67 at points 24 and 44, respectively. The switch 52 previously described in connection with FIG. 1 bridges switch terminal pair 38 and 40 and an opening 68 is provided in an overlying reflector member (only partially shown) of the conventional photoflash unit between said lamp 23 and the switch 52 to facilitate radiation transfer. When said lamp 23 is disposed in its usual operational position in the assembled photoflash unit, a portion of the envelope of the lamp is located approximately 2 millimeters from the switch. As the lamp 23 is flashed, light and heat radiation is transmitted to the switch 52 which turns the switch from the "off" condition to the "on" condition by initiating a thermal chemical reaction.

FIG. 3 shows an enlarged cross section of the switch configuration in FIG. 2 wherein a mass of switch material interconnects a pair of spaced apart electrical terminals. In this embodiment, the switch terminals 38 and 40 are mounted on the circuit board 10. The radiation switch 52 is applied to the circuit board 10 as a coating in electrical contact with the terminals 38 and 40. Each of the radiation switches 48, 50 and 52 upon receiving heat and/or light radiation from the adjacent flash lamp when it is flashed, changes from an open circuit of high electrical resistance to a closed circuit of low electrical resistance thereby connecting the switch terminals embedded therein to permit flashing of the next lamp in the sequence of the four-lamp group.

A preferred switching material of the present invention simply consists of 98 percent silver carbonate and 2 percent by weight ethyl hydroxyethyl cellulose binder which can be deposited on the circuit board from a suspension in mixed organic solvents that dissolve the cellulose binder constituent. As previously indicated, dispersal of the silver carbonate in said suspension can be facilitated with use of a non-ionic type organic surfactant. The dried switch material exhibits an electrical resistance value of approximately $10^{11}$ ohms before conversion as well as a lengthy shelf life storage under elevated temperature and humidity conditions.

It will be apparent from the foregoing description that various modifications may be made in the above improved switch material without departing from the true spirit and scope of the present invention. For example, various inert fillers can be incorporated in this switching material which do not modify the above specified non-stoichiometric ratio being maintained between the carbon-containing silver salt and the humidity-resistant organic polymer binder but which adjust rheological properties in the liquid coating mixture, if desired. It is intended to limit the present invention, therefore, only by the scope of the following claims.

What I claim as new and desire to secure by Letters Patent of the United States is:

1. A solid state switch device which more reliably converts from a high electrical resistance condition to a low electrical resistance condition when activated with radiation from an adjacent flash lamp, said switch device consisting of a carbon containing silver salt admixed with a humidity resistant organic polymer binder in ratios wherein said polymer binder does not exceed more than about 3 percent by weight in said admixture and provides a stoichiometric excess of said silver salt in said admixture.

2. A switch device as in claim 1 wherein an organic surfactant is substituted for part of the organic polymer binder in said admixture.

3. A switch device as in claim 2 wherein said organic surfactant is a non-ionic polymer material.

4. A switch device as in claim 1 wherein said silver salt is selected from the group consisting of silver carbonate, silver pyruvate, silver acetylacetonate, silver acetate, silver oxalate, silver citrate, silver behenate, silver benzoate and silver fumarate.

5. A switch device as in claim 1 wherein said organic polymer binder is selected from the group consisting of cellulose esters, cellulose ethers, acrylates, methacrylates, polycarbonates, polystyrene, and styrene copolymers.

6. A switch device as in claim 1 wherein an organic surfactant is substituted for part of the organic polymer binder in said admixture.

7. In a photoflash lamp unit comprising a pair of flash lamps connected in an electrical circuit to fire individually and in sequence with a solid state radiant energy switch device being located adjacent one of said lamps and disposed to receive radiant energy emitted by that lamp, the improvement wherein said solid state switch more reliably converts from a high electrical resistance condition to a low electrical resistance condition when activated with said radiant energy, said switch device consisting of a carbon containing silver salt admixed with a humidity resistant organic polymer binder in ratios wherein said polymer binder does not exceed more than about 3 percent by weight in said admixture and provides a stoichiometric excess of said silver salt in said admixture.

* * * * *